United States Patent [19]

Tobita

[11] Patent Number: 4,792,928

[45] Date of Patent: Dec. 20, 1988

[54] SEMICONDUCTOR MEMORY CIRCUIT WITH CONTROL OF BIT LINE VOLTAGE BALANCING

[75] Inventor: Youichi Tobita, Hyogo, Japan

[73] Assignee: Mitsubishi Denki Kabushiki Kaisha, Tokyo, Japan

[21] Appl. No.: 18,467

[22] Filed: Feb. 25, 1987

[30] Foreign Application Priority Data

Feb. 25, 1986 [JP] Japan .................................. 61-39390

[51] Int. Cl.$^4$ .......................... G11C 7/00; G11C 7/02
[52] U.S. Cl. .................................... 365/210; 365/189; 365/202; 365/207
[58] Field of Search ............... 365/210, 201, 207, 185, 365/205, 149, 230, 202, 189; 371/21

[56] References Cited

U.S. PATENT DOCUMENTS

| | | | |
|---|---|---|---|
| 3,962,686 | 6/1976 | Matsue et al. | 365/233 |
| 4,247,917 | 1/1981 | Tsang et al. | 365/210 |
| 4,342,102 | 7/1982 | Puar | 365/207 |
| 4,363,111 | 12/1982 | Heightley | 365/210 |
| 4,367,540 | 1/1983 | Shimohigashi | 365/207 |
| 4,393,475 | 7/1983 | Kitagawa et al. | 365/207 |
| 4,475,178 | 10/1984 | Kinoshita | 365/203 |
| 4,504,748 | 3/1985 | Oritani | 307/530 |
| 4,507,759 | 5/1985 | Yasui et al. | 365/189 |
| 4,551,820 | 11/1985 | Matsuura | 365/210 |
| 4,658,377 | 4/1987 | McElroy | 365/230 |

Primary Examiner—Terrell W. Fears
Assistant Examiner—Melissa J. Koval
Attorney, Agent, or Firm—Birch, Stewart, Kolasch & Birch

[57] ABSTRACT

A semiconductor memory circuit includes: a plurality of memory cell columns each comprising a plurality of memory cells connected to a bit line, at least a dummy cell connected to a bit line constituting a bit line pair with said bit line, a sense amplifier connected between said two bit lines, and at least a FET for balancing the voltages of said two bit lines; and a balance control circuit for detecting the termination of selection of a dummy word line which is provided for the control of the dummy cell and thereafter operating the FET.

2 Claims, 4 Drawing Sheets

1

SEMICONDUCTOR MEMORY CIRCUIT WITH CONTROL OF BIT LINE VOLTAGE BALANCING

FIELD OF THE INVENTION

The present invention relates to a semiconductor memory circuit using an insulator gate type field effect transistor (hereinafter referred to as "MOST"), and more particularly to an improvement in the bit line voltage balancing circuit which can be effectively used in a dynamic type semiconductor memory circuit.

BACKGROUND ART

FIG. 3 shows a circuit construction of a prior art random access memory device (hereinafter referred to as "RAM"). In this device there are provided a plurality of memory cell columns each having a lurality of MOSTs, two dummy cells, an address decoder and dummy decoder for selecting a memory cell and dummy memory cell, respectively, a plurality of sense amplifiers for amplifying data read out from the memory cells, precharging and voltage balancing circuits for the bit lines, and pull down circuits for word lines.

In FIG. 3, the reference numerals 1al to 1an and 1bl to 1bn designate one bit memory cells, which store data of logical value "1" or "0". The reference numerals 1cl to 1cn and 1dl to 1dn designate one bit dummy cells, the reference numerals 41 to 4n and 51 to 5n designate bit lines for transmitting memory cell data, and these bit lines 41 to 4n and 51 to 5n transmit complementary data. The reference numerals 6a and 6b designate word lines to which signal $\phi w$ for driving a memory cell is supplied. The reference numerals 6c and 6d designate dummy word lines to which signal $\phi w$ for driving a dummy cell is also supplied.

The reference numerals 2al to 2an and 2bl to 2bn designate memory capacitances for storing memory cell data one end of which are connected to the nodes 3al to 3an and 3bl to 3bn and the other end of which are connected to ground. The reference numerals 2cl to 2cn and 2dl to 2dn designate dummy capacitances which have about half the capacitance value of those of the memory cells 2al to 2an and 2bl to 2bn. One end thereof are connected to the nodes 3cl to 3cn and 3dl to 3dn, and the other ends thereof are connected to ground. These dummy capacitances function to supply a reference voltage at the reading out of memory cell data. The reference numerals 7al to 7an and 7bl to 7bn designate switching MOSTs one main electrode of which are respectively connected to the nodes 3al to 3an and 3bl to 3bn. The other main electrodes thereof are respectively connected to the bit lines 41 to 4n and 51 to 5n, and the gate electrodes thereof are respectively connected to the nodes 10al to 10an and 10bl to 10bn on the word lines. These switching MOSTs function to read out, to write in, or to hold the data of memory capacitances 2al to 2an, 2bl to 2bn.

The reference numerals 7cl to 7cn and 7dl to 7dn designate switching MOSTs one main electrode of which are respectively connected to the nodes 3cl to 3cn and 3dl to 3dn. The other main electrodes thereof are respectively connected to the bit lines 41 to 4n and 51 to 5n, and the gate electrodes thereof are respectively connected to the nodes on the dummy word lines 10cl to 10cn and 10dl to 10dn. These switching MOSTs function to read out the reference data from the dummy capacitances 2cl to 2cn and 2dl to 2dn. The reference numerals 29cl to 29cn and 29dl to 29dn designate MOSTs whose one main electrode of which are respectively connected to the nodes 3cl to 3cn and 3dl to 3dn. The other main electrodes thereof are connected to the ground, and the gate electrodes thereof are connected to the terminal 27 to which clock signal $\overline{\phi_D}$ is supplied. These MOSTs function to provide for the next read out operation by setting the level of dummy capacitance to "0" in the waiting state of the RAM.

The reference numerals 8al to 8an and 8bl to 8bn designate parasitic resistances of the word lines one end of which are respectively connected to the nodes 10al to 10an and 10bl to 10bn, and the other ends thereof are respectively connected to the nodes 9al to 9an and 9bl to 9bn. These resistances are usually accompanied within a circuit wherein a lot of pairs of bit lines each pair being connected to the same sense amplifier 241 to 24n are arranged in parallel with each other as shown in FIG. 3. It is sufficient to use, a double layer wiring technique using aluminum having a low resistance value so as to reduce the above-described resistances. However, this technique is not generally used due to an increase in production process steps and reduction in reliability in second aluminum wiring. Thus, a high melting point metal such as polysilicon having relatively large resistance is commonly used in view of easiness in production.

The reference numerals 8cl to 8cn and 8dl to 8dn designate parasitic resistances of the dummy word lines one end of which are respectively connected to the nodes 10cl to 10cn and 10dl to 10dn, and the other ends thereof are respectively connected to the nodes 9cl to 9cn and 9dl to 9dn.

The reference numerals 11al to 11an and 11bl to 11bn designate parasitic capacitances of the word lines one end of which are respectively connected to the nodes 9al to 9an and 9bl to 9bn, and the other ends thereof are connected to ground.

The reference numerals 11cl to 11cn and 11dl to 11dn designate parasitic capacitances of the dummy word lines one end of which are respectively connected to the nodes 9cl to 9cn and 9dl to 9dn, and the other ends thereof are connected to ground.

The reference numerals 111 to 11n and 121 to 12n designate bit line charging MOSTs provided between the bit lines 41 to 4n and 51 to 5n and the power supply terminal 19 (voltage V), respectively, and the gate electrodes thereof are connected to the nodes 141 to 14n, respectively. P channel MOSTs are used for these MOSTs, which are of reverse conductivity types to the MOSTs used for memory cells.

The reference numerals 131 to 13n designate bit line voltage balancing MOSTs which are provided between respective pairs of bit lines 41 to 4n and 51 to 5n, and the gate electrodes thereof are connected to the nodes 141 to 14n. P channel MOSTs are also used for these MOSTs. The nodes 141 to 14n are connected to the terminal 22 to which clock signal $\phi_E$ is supplied.

The reference numerals 241 to 24n designate sense amplifier circuits which are connected to respective pairs of bit lines and the terminals 251 to 25n to which clock signal $\phi_S$ is supplied, and these sense amplifier circuits function to amplify a micro voltage difference appearing between respective pairs of bit lines.

The reference numerals 301 to 30n designate MOSTs provided between the bit lines 41 to 4n and nodes 251 to 25n, respectively, and the gate electrodes thereof are connected to the bit lines 51 to 5n, respectively. Furthermore, the reference numerals 311 to 31n designate MOSTs provided between the bit lines 51 to 5n and nodes 251 to 25n, respectively, and the gate electrodes thereof are connected to the bit lines 41 to 4n, respectively.

These MOSTs 301 to 30n and 311 to 31n are connected in a cross coupled configuration to constitute a flip-flop circuit.

The reference numeral 33 designates a MOST provided between the power supply terminal 19 and node 35, and the gate electrode thereof is connected to a terminal 36 to which clock signal $\phi_S$ is supplied. The reference numeral 34 designates a MOST which is provided between a node 35 and ground, and the gate electrode thereof is connected to a terminal 37 to which clock signal $\overline{\phi_{SO}}$ is supplied. The reference numeral 32 designates a MOST for driving the sense amplifiers 241 to 24n provided between the nodes 251 to 25n and ground, and the gate electrode thereof is connected to the node 35.

The reference numeral 21a designates a decoder circuit for decoding address signals Axl, $\overline{Axl}$ ... Axn, $\overline{Axn}$ which are supplied from terminals 18a and outputting a voltage to one of outputs 16a, 16b .... To this decoder circuit the power supply voltage V and clock signal $\overline{\phi_P}$ are supplied from terminals 19 and 20, respectively.

The reference numeral 21b designates a dummy decoder circuit for decoding the LSB of the column address Axl, $\overline{Axl}$ which are supplied from a terminal 18b and outputting a voltage to one of outputs 16c and 16d, and to this dummy decoder circuit the power supply voltage V and clock signal $\overline{\phi_P}$ are supplied from the terminals 19 and 20, respectively. The reference numerals 15a and 15b designate MOSTs for connecting the word line driving signal $\phi_W$ which is supplied to the terminal 17 to the word line in accordance with the levels of outputs 16a and 16b of decoder circuit 21a. The reference numerals 15c and 15d designate MOSTs for connecting the word line driving signal $\phi_W$ which is supplied to the terminal 17 to the dummy word line in accordance with the levels of outputs 16c and 16d of dummy decoder circuit 21b. The reference numerals 23a and 23b designate MOSTs provided between the nodes at one end of word lines 28a and 28b and the ground, and the gate electrodes thereof are connected to the terminal 26 to which clock signal $\overline{\phi_C}$ is supplied, and these MOSTs function to reduce noise voltages of the unselected word lines.

The reference numerals 23c and 23d designate MOSTs provided between the nodes 28c and 28d at one end of dummy word lines and ground, and the gate electrodes thereof are connected to the terminal 26 to which clock signal $\overline{\phi_C}$ is supplied, and they function to reduce noise voltages of the unselected dummy word lines.

The circuit operation of FIG. 3 will be described with reference to FIG. 4. FIG. 4 shows the circuit operation while reading out data from the memory cells $1a_l$ to $1a_n$. In this figure it is assumed that "0" data is stored in each memory cell.

Until time $t_0$ all the outputs 16a, 16b ... of decoder 21a are precharged to "1" by the clock signal $\overline{\phi_P}$, and the outputs 16c, 16d of dummy decoder 21b are also precharged to "1". The bit lines 41 to 4n and 51 to 5n are also precharged to the power supply voltage V by the clock signal $\phi_E$. All the word lines and dummy word lines have the level "0" of clock signal $\phi_W$, and these word lines are in "0" state while the MOSTs 15a, 15b ... 15c, 15d are all turned on, and all the memory cells and dummy cells are in unselected states. The MOSTs 23a, 23b ..., 23c, 23d are all turned on due to the clock signal $\overline{\phi_C}$ being "1", whereby the word lines and dummy word lines are strongly fixed at "0". When the clock signal $\overline{\phi_P}$ becomes "0" at time $t_0$, the precharging of the decoder and dummy decoder is finished. Next, when address signals are applied to terminals 18a at time $t_1$ the outputs 16a, 16b ... of decoder 21a are all "0" except for one.

Hereinafter, it is assumed that only the output 16a are "1" and that the other outputs become all "0".

On this assumption, only the MOST 15a is turned ON, and the memory cells $1a_l$ to $1a_n$ connected to the left side bit lines 41 to 4n of bit line pairs, respectively, are selected by the clock signal $\phi_W$. Then, the dummy decoder functions to select the dummy cells $1d_l$ to $1d_n$ which are connected to the right side 16d "1". After the selections by the decoder and by the dummy decoder are completed, the clock signal $\phi_E$ becomes V at time $t_2$. Thus the MOSTs 111 to 11n and 121 to 12n and 131 to 13n are turned OFF, the bit lines are at a high impedance state, and the device enters a waiting state for reading out of cell data. At the same time the clock signal $\overline{\phi_C}$ comes to have a value which is slightly higher than the threshold voltage $V_{TH}$ of MOSTs 23a to 23d, and the word lines except for the word line 6a and dummy word line 6d are grounded to "0" with a relatively high resistance.

Next, the clock signal $\phi_W$ starts to rise up at time $t_3$, and it reaches a final level V at time $t_4$. Thus the voltages of the word line 6a and dummy word line 6d rise up, but the time periods required for rising up are different depending on the positions on the word lines. That is, at the nodes $10a_l$ and $10d_l$ in the neighborhood of input point of clock signal $\phi_W$ the voltages of word lines rise up faster, but at the far side nodes $10a_n$ and $10d_n$ the voltages of word lines rise up slowly. This is caused by parasitic resistances and capacitances accompanying the word lines and dummy word lines. Usually this delay is about 20 ns in the case of a 256 K bit RAM. In other words, the nodes $10a_l$ and $10d_l$ rise up to the power supply voltage V at the same time $t_4$ as that of the clock signal $\phi_W$, the nodes $10a_n$ and $10d_n$ reaches the power supply voltage V at time $t_5$ which is about 20 ns after time $t_4$. As the voltages of nodes $10a_l$ to $10a_n$ and $10d_l$ to $10d_n$ rise up the MOSTs $7a_l$ to $7a_n$ and $7d_l$ to $7d_n$ are turned ON, and the memory cell data and reference data are read out to the bit lines.

In this case as "0" data is stored in each memory cell the voltages of bit lines 41 to 4n are lowered. On the other hand, at the sides of bit lines 51 to 5n the reference data is read out from the dummy cell, whereby the voltages of bit lines 51 to 5n are lowered. However, the levels of bit lines 51 to 5n are higher than those of bit lines 41 to 4n. This is because the dummy cell capacitances are set at about half the capacitance of the memory cell capacitances as described above. Directly before time $t_5$ the clock signal $\phi_S$ rises up from 0 to V, thereby turning ON the MOST 33. Then, as the clock $\overline{\phi_{SO}}$ is "0" the MOST 34 is in OFF state.

By the turning ON of the MOST 33 the gate voltage of the MOST 32 rises up thereby to turn ON the MOST 32, and the signal $\overline{\phi_S}$, that is, the voltages of nodes 251 to 25n start to be lowered (time $t_5$). When the clock signal $\overline{\phi_S}$ falls down the micro voltage differences between the bit lines 41 to 4n and bit lines 51 to 5n are amplified by the sense amplifiers 241 to 24n. At time $t_6$ when the falling of clock signal $\overline{\phi_S}$ is completed the voltages of bit lines 41 to 4n become "0" and the bit lines 51 to 5n become levels slightly lower than V, completing the amplification. This large voltage difference is transmitted to the latter stage circuit (not shown), and read out to the output of the RAM.

When the above-described reading out operation is completed, it is necessary to transit to a waiting state for reading out of the other memory cells. When transiting to the waiting state the voltage levels of memory cell capacitances are desirable to be perfect "0" or "1" level. When deviated from a complete level, the read out margin at the next read out operation is reduced. In order to satisfy this condition the MOSTs 301 to 30n and MOST 32 must be turned ON and the voltages of bit lines 41 to 4n must be fixed to the low impedance state of "0" until the voltage of word line 6a become 0 and MOSTs 7a1 to 7an are turned OFF. Furthermore, in order to avoid dead power consumption the MOST 32 must be turned OFF at the balanced state of the bit line voltage.

The operation waveforms while transiting to a waiting state after time $t_7$ are shown in FIG. 4.

At time $t_7$ the clock $\phi_W$ starts to fall and it reaches the final level "0" at time $t_8$. Thus the voltages of the word line 6a and dummy word line also fall, and the times of falling are different dependent on the positions on the word line similarly as in cases of rising up. That is, at the nodes 10an, 10dn the falling down is slow and at the nodes 10al, 10dl it is fast. Herein, in order for the MOST 7an to enter a waiting state the gate voltage thereof is required to be a level lower than the threshold voltage V TH and it is turned OFF. Accordingly, the MOST 7an enters a waiting state approximately at time $t_9$.

After the MOST 7an is turned OFF the clock $\overline{\phi_{S0}}$ becomes "1" thereby to turn ON the MOST 34 and to make the level of node 35 "0", whereby the MOST 32 is turned OFF. Next, at time $t_9$ the clock $\phi_E$ starts to fall, and the balancing and precharging of bit line voltage starts at that time. Thus, the MOSTs 111 to 11n, 121 to 12n, and 131 to 13n are turned ON, thereby making the voltages of bit lines 41 to 4n rise up and the voltages of bit lines 51 to 5n start to fall transitorily. They rise up to the power supply voltage V at time $t_{11}$, and the voltages of bit lines become approximately equalized levels (Theoretically it requires an infinite time for the voltages to be completely equalized to each other). When the balancing is insufficient and the voltage difference between a pair of bit lines is large the read out voltage margin at the next read out operation is lowered, thereby causing a malfunction.

Besides, at a time close to time $t_9$ there occur rising up of clocks $\overline{\phi_P}$, $\overline{\phi_C}$ and falling of the column address Ax1, $\overline{Ax1}$, ......, Axn, $\overline{Axn}$. However, these have no direct relation to the present invention.

As described above, the balancing of the bit line voltage must be conducted as soon as possible so as to enable a large read out margin at the next read out operation. Accordingly, it is most effective to conduct the balancing of the bit line voltage directly after the turning OFF of the memory cell switching MOST.

In the above-described prior art device the start timing of balancing, that is, the generation timing of clock $\phi_E$ is determined by a delay circuit comprising a cascade connection of MOST inverter circuits having clock signal $\phi_W$ as a reference. In this prior art device a resistor comprising a relatively high resistance, high melting point metal is used for the word line while such a resistor is not used in the above-described delay circuit.

In a case where the resistance of the resistor used for a word line becomes high dependent on variation in production the falling time becomes longer as shown by dotted lines of 10an, and the time required for turning OFF the switching MOST of a memory cell becomes long (time $t_{10}$). When the balancing of bit lines is started in this state at time $t_9$, the voltage of bit line 4n starts to rise up before the switching MOST becomes OFF. This causes entering of a high voltage into the memory cell 1an, which results in a malfunction.

In the prior art device of such a construction the variation of the resistance in production is presumed to be one obtained from calculation, and the start timing of the bit line voltage balancing is delayed over a period longer than required for the sake of safety. Thus the operation, cycle time of RAM (from time $t_0$ to $t_0'$ in FIG. 2) is lengthened.

SUMMARY OF THE INVENTION

An object of the present invention is to provide an improved semiconductor memory circuit capable of starting the bit line voltage balancing faster.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor memory circuit comprising: a memory circuit including a plurality of memory cell columns each comprising a plurality of memory cells connected to a bit line, at least a dummy cell connected to a bit line constituting a bit line pair with said bit line, a sense amplifier connected between said two bit lines, and at least a FET for balancing the voltages of said two bit lines; and balance control means for detecting the termination of selection of a dummy word line which is provided for the control of said dummy cell and thereafter operating said FET.

DETAILED DESCRIPTION OF THE PREFERRED EMBODIMENTS

Figure 1:
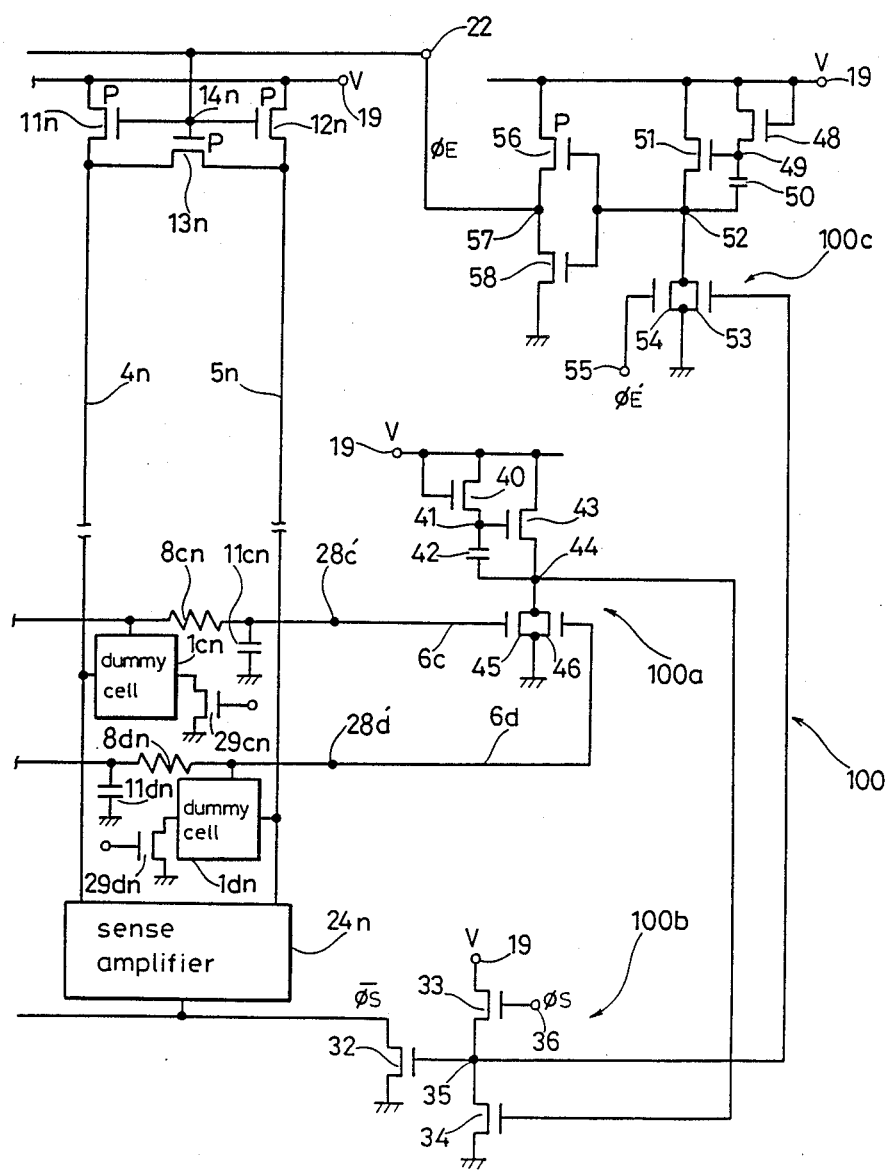
FIG. 1 is a circuit diagram showing a semiconductor memory circuit as an embodiment of the present invention.

In order to explain the present invention in detail, reference will be particularly made to FIG. 1.

Figure 3:
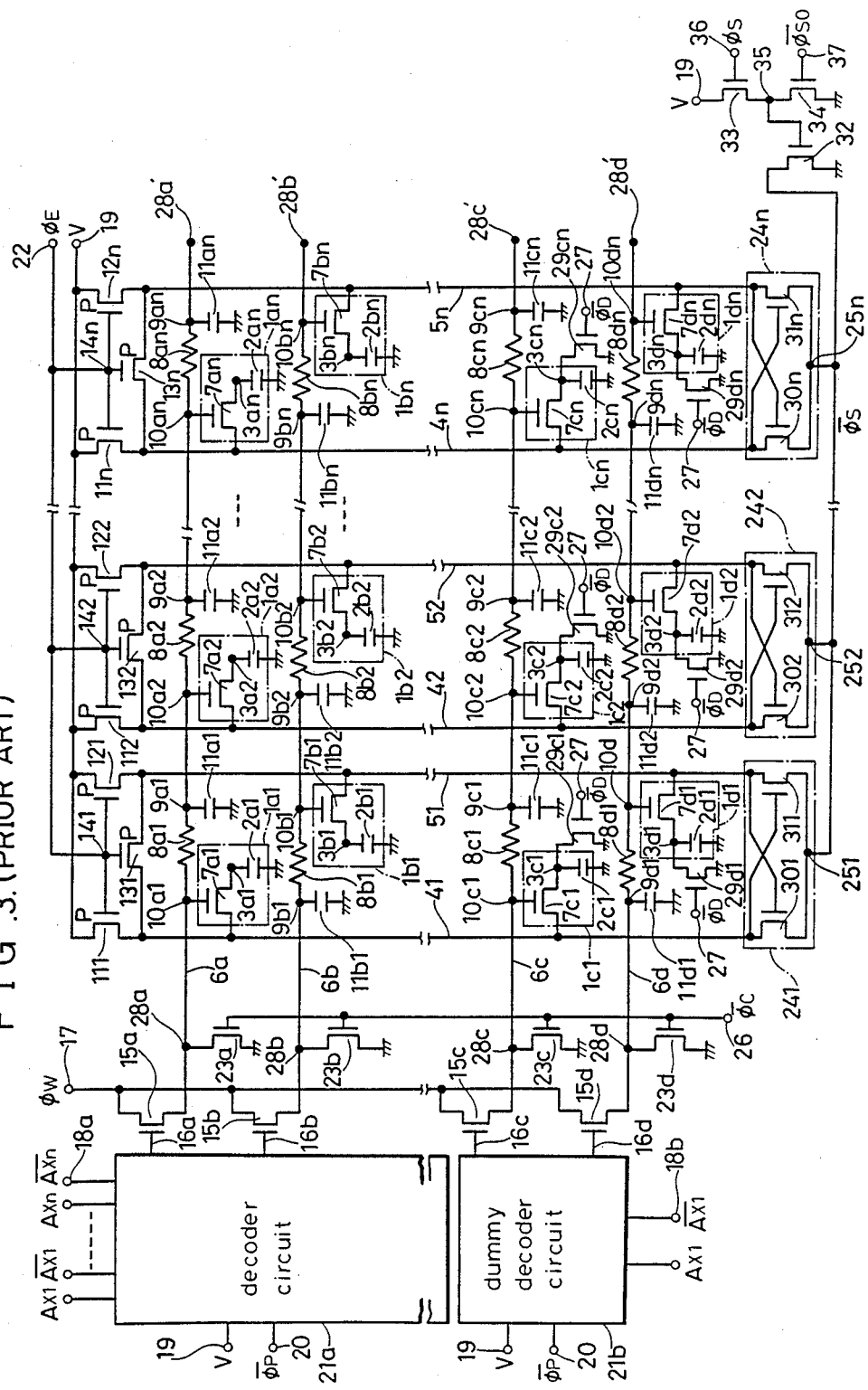
FIG. 3 is a diagram showing a prior art semiconductor memory circuit.
Figure 4:
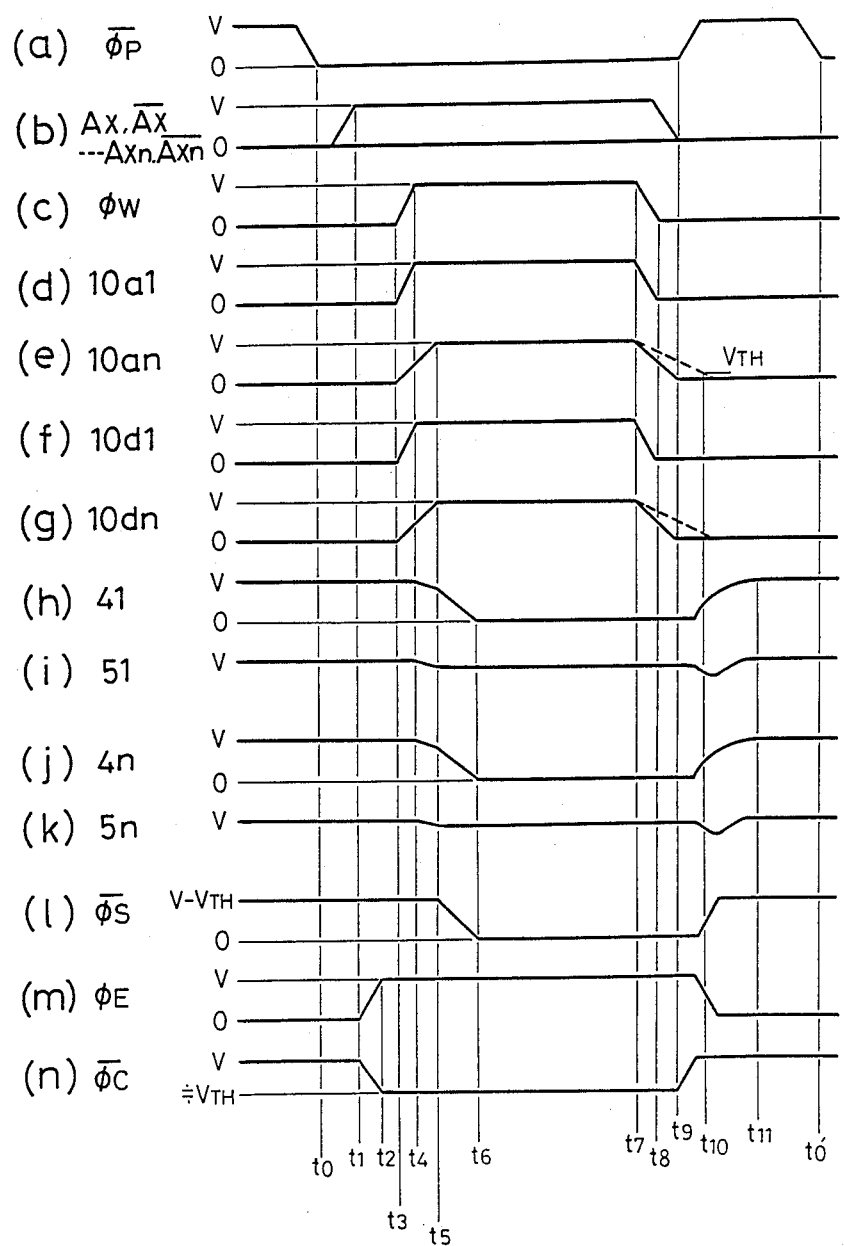
FIG. 4 is a timing diagram for explaining the operation of the circuit of FIG. 3.

FIG. 1 is a circuit diagram showing a bit line balancing signal generator in a semiconductor memory circuit as an embodiment of the present invention. In FIG. 1, the same reference numerals designate the same elements as those shown in FIG. 3.

In FIG. 1, the reference numeral 100 designates a balancing control means for detecting the conclusion of selection of a dummy word line and thereafter operating the bit line voltage balancing FETs 141 to 14n. This balancing control means is constituted by circuits 100a, 100b, and 100c. The circuit 100a comprising circuit elements 40 to 46 is a first control circuit which is designed to detect the conclusion of selection of a dummy word line from the voltages at the ends of the dummy word lines 6c and 6d, and this is constituted by a general two input bootstrap inverter circuit. In this circuit 100a, the reference numeral 40 designates a charging MOST whose gate and drain are connected to the power supply terminal 19 and whose source is connected to a node 41. The reference numeral 42 designates a voltage rising capacitance whose one end is connected to the node 41 and whose other end is connected to a node 44 which is the output node of the bootstrap inverter circuit. The reference numeral 43 designates a load MOST which is provided between the power supply terminal 19 and the output node 44, and whose gate electrode is connected to one end of the voltage rising capacitance 42. The reference numeral 45 designates a driver MOST provided between the output node 44 and the ground, and the gate electrode thereof is connected to the other end of the dummy word line 6c. The reference numeral 46 designates a driver MOST which is provided between the output node 44 and the ground, and whose gate electrode is connected to the other end of the dummy word line 6d.

The circuit 100b comprising circuit elements 33 and 34 is a second control circuit which is designed to conduct an operation control of the sense amplifiers 241 to 24n, and this circuit outputs a signal for halting the sense amplifiers' operation to a first FET 32 when the dummy word line is not selected. In this circuit 100b, the reference numeral 33 designates a MOST whose drain is connected to the power supply terminal 19, whose gate is connected to the terminal 36, and whose source is connected to a node 35. The reference numeral 34 designates a MOST whose drain is connected to the node 35, whose gate is connected to the node 44, and whose source is connected to ground.

The circuit 100c comprising circuit elements 48 to 54 is a third control circuit which is designed to receive the output of the second control circuit 100b and to operate the second FETs 14 to 14n after the conclusion of sense operations of the sense amplifiers 241 to 24n, and this circuit 100c is constituted by a general two input bootstrap inverter circuit. In this circuit 100c, the reference numeral 48 designates a charging MOST whose gate and drain are connected to the power supply terminal 19, and whose source is connected to a node 49. The reference numeral 50 designates a voltage rising capacitance whose one end is connected to the node 49, and whose other end is connected to a node 52 which is the output node of the bootstrap circuit. The reference numeral 51 designates a load MOST provided between the power supply terminal 19 and the output node 52, and the gate electrode thereof is connected to the voltage rising capacitance 50. The numeral 53 designates a driver MOST which is provided between the output node 52 and the ground, and whose gate electrode is connected to the node 35. The numeral 54 designates a driver MOST provided between the output node 52 and ground, and the gate electrode thereof is connected to a terminal 55 to which clock signal $\phi_E'$ is supplied. The reference numerals 56 and 58 designate MOSTs constituting a complementary inverter circuit, and the reference numeral 56 designates a P channel MOST provided between the power supply terminal 19 and the node 57, and the gate electrode thereof is connected to the node 52. The reference numeral 58 designates a MOST provided between the node 57 and ground, and the gate electrode thereof is connected to the node 52.

The operation of the circuit of FIG. 1 will be described with reference to FIG. 2.

The circuit of FIG. 1 operates at concurrently at the operation of the memory cell, the operation principle being to generate a signal for balancing the bit line voltages using the voltage difference between the ends of the two dummy word lines which have the latest transmission speed, and to generate a signal for balancing the bit line voltage with the above-described voltage difference as a reference voltage.

Figure 2:
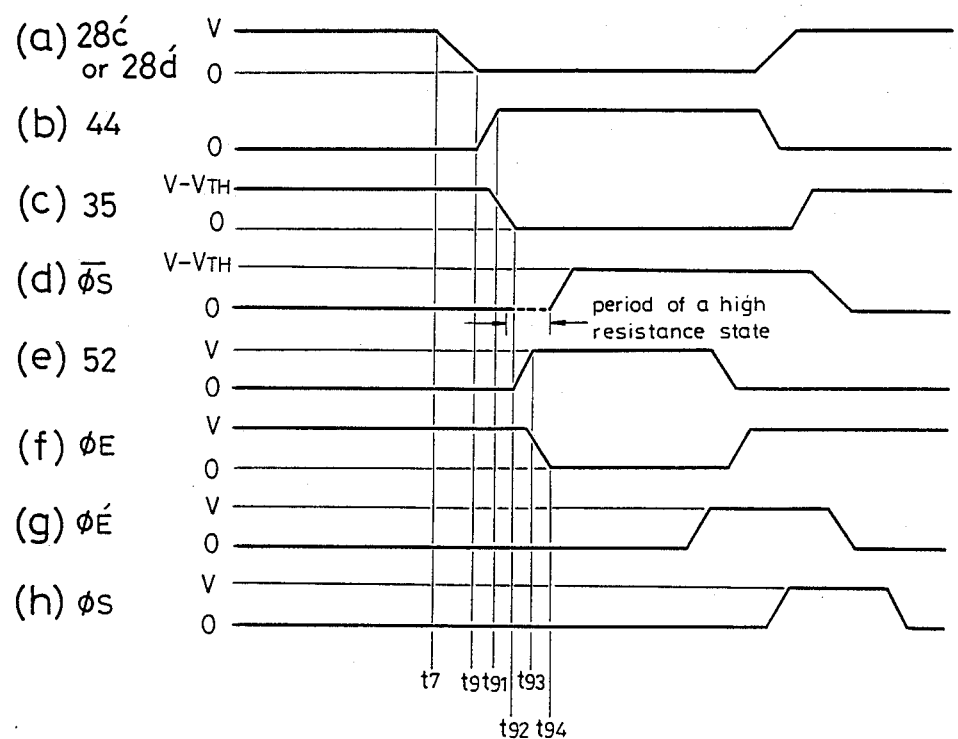
FIG. 2 is a timing diagram for explaining the operation of the circuit of FIG. 1.

When the voltage of node 28c' at the end portion of the dummy word line 6c (28d' when the dummy word line 6d is selected) starts to fall at time $t_7$ of FIG. 2 and it becomes "0" at time $t_9$, the driver MOST 45 is turned OFF. By this the level of output node 44 of the bootstrap inverter circuit 100a rises up from approximately 0 to V at time $t_{91}$. As the level of output node 44 rises up the MOST 34 is turned ON, and the level of node 35 falls down from V−VTH to "0" (at time $t_{92}$). By this the MOST 32 is turned OFF and the connections between each bit line and ground are cut off through the MOST 32. Then, the clock signal $\overline{\phi_S}$ becomes a high resistance state of 0 level.

When the level of node 35 becomes "0" the driver MOST 53 whose gate electrode is connected to the node 35 is turned OFF, and the level of output node 52 of the bootstrap inverter circuit 100c rises up from approximately 0 to the power supply voltage V (at time $t_{93}$).

By this the level of the output node of the next stage complementary inverter falls from V to 0, and the bit line voltage balancing MOSTs 131 to 13n and charging MOSTs 111 to 11n and 121 to 12n which are both P channel MOSTs are turned ON, thereby conducting the balancing and charging of the bit line voltage.

In the present embodiment the most delayed signal at the end of the dummy word line is detected, and the balancing of source voltages of the sense amplifiers and bit line voltages are conducted with using this detected voltage as a reference, the level of the memory cell in a waiting state can be completely stabilized regardless of variation in the resistance value of the word line, and wasteful power consumption during bit line balancing is reduced. Furthermore, the balancing of the bit line voltage can be conducted at a high speed without destroying the memory cell content.

Besides, in the above-illustrated embodiment the clock signal $\phi_E'$ places the bit line at a high impedance state directly before a voltage is supplied to the word line for reading out of memory cell data, and this functions to make the clock $\phi_E$ V level by being supplied to the gate of MOST 54 before the word line voltage rises up by the signal for turning OFF the MOSTs 111 to 11n, 121 to 12n, and 131 to 13n. However, this has no direct relation to the operation of the present invention.

In the illustrated embodiment P channel MOSTs are used for the bit line balancing MOSTs and charging MOSTs, but N channel MOSTs can be used instead with the same effects. In this case it is required that the polarity of clock $\phi_E$ should be reversed and the level should be set at a value larger than V+VTH.

Furthermore in the illustrated embodiment, N channel MOSTs are used for MOSTs of the memory cells, but P channel MOSTs can be used instead by only reversing the polarities of each signal and MOSTs with the same effects as above described embodiment.

As is evident from the foregoing description, according to the present invention, the most delayed signal at end of the dummy word line is detected and balancing of the bit line voltages is conducted with this detected signal as a reference, whereby execution of balancing has become possible at the time when the balancing is actually made possible. This realizes a higher speed bit line voltage balancing than that of the prior art device.

What is claimed is:

1. A semiconductor memory circuit comprising:
   a plurality of bit lines extending in a first direction;
   a plurality of word lines extending in a second direction perpendicular to said first direction,
   said plurality of bit lines being arranged in pairs with each pair of bit lines forming a memory column of a first bit line and a second bit line, said plurality of bit line pairs forming a plurality of memory columns;
   a plurality of memory cells connected to either a first bit line or a second bit line of said memory columns,
   each of said plurality of word lines being connected to a first bit line memory cell or a second bit line memory cell in each of said plurality of memory columns;
   a plurality of dummy cells each connected to a first or second bit line of said memory columns;
   a first dummy word line connected to each first bit line dummy cell;
   a second dummy word line connected to each second bit line dummy cell;
   sense amplifier means, connected between each first bit line and second bit line, for sensing a voltage difference therebetween;
   FET means, connected between each first bit line and second bit line, for balancing voltages appearing thereon;
   selection means for selecting either said first or said second dummy word line for control of a specified dummy cell in each memory column; and
   balancing control means, operatively interconnected with said dummy word lines and said FET means, for detecting the termination of dummy word line selection by said selection means and activating said FET means in response thereto.

2. A semiconductor memory circuit as defined in claim 1, wherein said balance control means comprises a first control circuit for detecting that a voltage at an end of a previously selected dummy word line is equal to a predetermined voltage and outputting a detection signal indicative thereof, a second control circuit for generating a control signal to halt the sensing operation of said sense amplifier means in response to said detection signal, and a third control circuit for operating said FET after said sensing operation has been halted.

* * * * *